United States Patent [19]
Chu et al.

[11] Patent Number: 5,631,933
[45] Date of Patent: May 20, 1997

[54] PHASE-LOCKED DIGITAL SYNTHESIZERS

[75] Inventors: David C. Chu, Woodside; Jeremy S. Sommer, Los Altos, both of Calif.

[73] Assignee: Hewlett-Packard Company, Palo Alto, Calif.

[21] Appl. No.: 604,231

[22] Filed: Feb. 21, 1996

[51] Int. Cl.$^6$ ................................................. H04L 23/00
[52] U.S. Cl. ............................................. 375/354; 375/376
[58] Field of Search ...................................... 375/377, 376, 375/371, 354; 327/158, 147, 156; 370/105.3

[56] References Cited

U.S. PATENT DOCUMENTS

| | | | |
|---|---|---|---|
| 4,030,045 | 6/1977 | Clark | 375/376 |
| 4,330,854 | 5/1982 | Zeitraeg | 370/105.3 |
| 4,970,473 | 11/1990 | Lietar | 331/1 A |
| 5,194,828 | 3/1993 | Kato et al. | 375/376 |
| 5,391,996 | 2/1995 | Marz | 327/158 |

*Primary Examiner*—Stephen Chin
*Assistant Examiner*—Betsy P. Lee
*Attorney, Agent, or Firm*—Pamela Lau Kee

[57] ABSTRACT

A master and a slave digital frequency synthesizer are phase-locked such that the master synthesizer is always selected to minimize the phase hits which occur when switching the master to be a slave and vice versa. The switching rearrangement is done automatically and rapidly in the event of failure of the master frequency synthesizer.

4 Claims, 5 Drawing Sheets

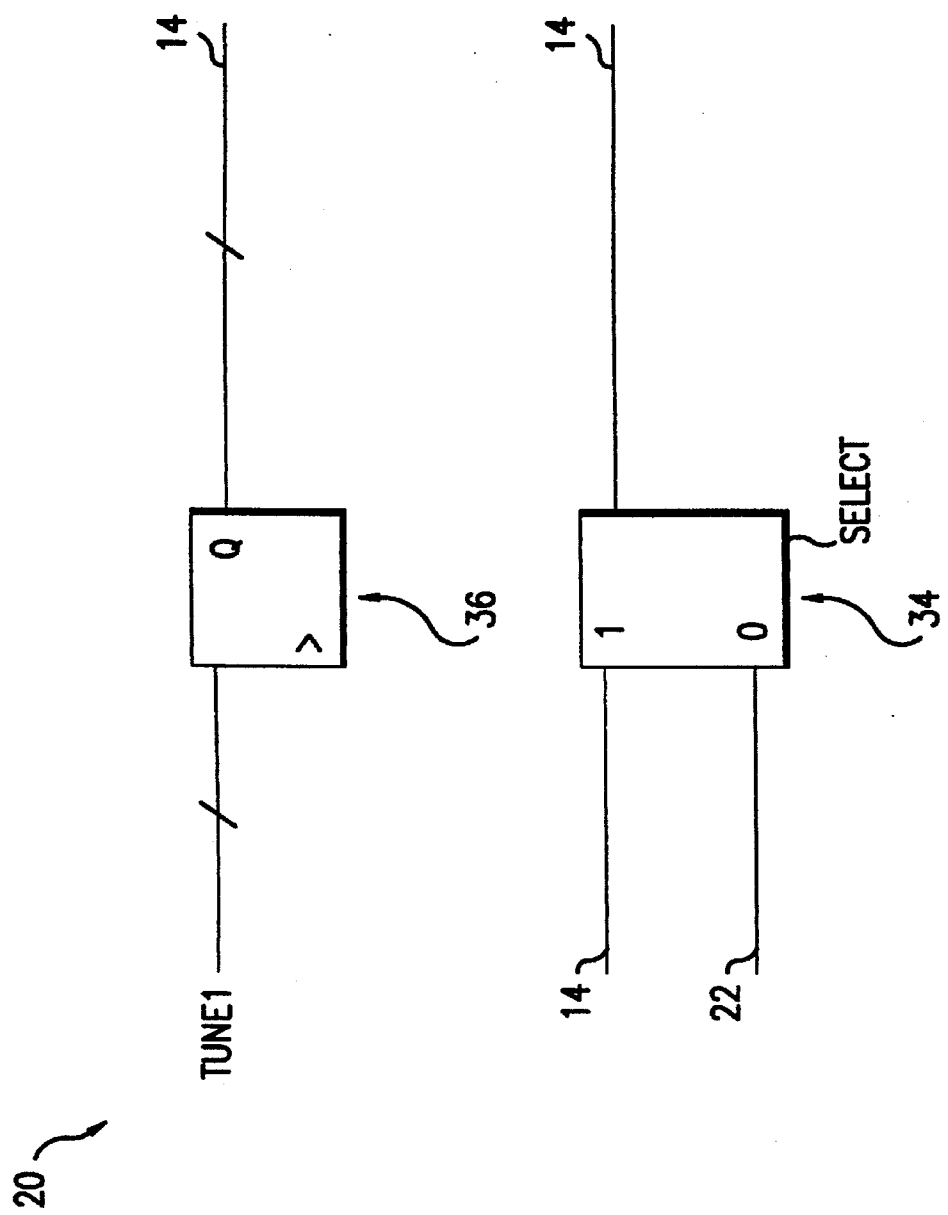

5,631,933

PHASE-LOCKED DIGITAL SYNTHESIZERS

FIELD OF THE INVENTION

The present invention is directed towards maintaining synchronization of frequency synthesizers for use in telecommunications. In particular, the invention is directed towards phase synchronizing frequency synthesizers whose frequencies are disciplined by the same reference.

BACKGROUND OF THE INVENTION

Telecommunications timing signal generators (TSGs) commonly incorporate redundant frequency synthesizers such that no single failure will interfere with the generation of the output signal. Because only one of the frequency synthesizers is selected at any particular time, the failure of the selected frequency synthesizer initiates a rearrangement such that a backup frequency synthesizer is selected. In the simplest design, no attempt is made to synchronize the phases of the frequency synthesizers. This results in a rearrangement that generally causes a large phase hit on the output.

One prior art approach compensates for the differential delay between the frequency synthesizers by adding equivalent delays in the output signal path. FIG. 1 illustrates a block diagram of a prior art implementation of the delay-compensation method of frequency synthesizer synchronization. Two independent digital frequency synthesizers, driven by separate local oscillators and tuning inputs, are both made to track the same external reference frequency. To prevent reference rearrangement from causing output phase hits, the frequency synthesizer outputs are compared in phase, producing an error signal which is amplified and integrated by some transfer function A, and then applied to the control input of the variable delay which follows the frequency synthesizer chosen to be the slave.

In practice, the variable delays may need to be of relatively complex design to permit unlimited range of compensation over time. Furthermore, during a slave-to-master transition in a clock rearrangement, the value of the delay applied to the slave frequency synthesizer must be latched and held.

In another prior art approach, the output of the selected frequency synthesizer is used as the tracking reference for the backup frequency synthesizer, using the normal tracking hardware and firmware. However, it requires two alterations to the tracking algorithm in order to be useful: phase alignment to the reference is required, and the tracking bandwidth must be greatly increased in order to maintain phase lock in the presence of output wander.

It would be desirable to have a phase-locked digital frequency synthesizer that did not require integration in the feedback path or explicit storage of delay compensation. It would be further beneficial if the frequency synthesizers had a high bandwidth of synchronization feedback loop without firmware intervention.

SUMMARY OF THE INVENTION

The present invention takes direct control of the synthesizer frequency. There are two independent digital frequency synthesizers, both tracking the same or closely similar external reference frequencies, such that frequency is tracked, but phase is arbitrary. At any time, one is designated master, and the other slave. The master frequency synthesizer is completely controlled by the frequency reference tracking algorithm. A phase detector which may be, but need not be, as simple as just a single flip-flop compares the output phases of the master and slave frequency synthesizers, and generates an error signal which is introduced as a modifier of frequency or phase for the slave frequency synthesizer, such that a phase difference causes the slave synthesizer frequency or phase to be altered in a compensatory direction. Given that the phase detector output may be a single-bit result, translation to a compensatory stimulus is simple to implement. Also, the entire functionality of synchronization may be realized in hardware, with no firmware intervention necessary except to perform a clock rearrangement. This makes it possible to provide for a high synchronization bandwidth, minimizing residual error. It is obvious for a feed forward frequency synthesis algorithm where the output is not fed back for its own synthesis that the synthesizer modifier in no way affects the tracking algorithm. During rearrangement, the tracking algorithm comes back into play smoothly, being valid even when usurped by the synthesizer modifier. Phase continuity is assured since the slave synthesizer is both in frequency and in phase with the master. The "delay compensation" is effectively performed by the frequency synthesizer with the "latching" provided by the phase memory which it must have anyway in order to function.

BRIEF DESCRIPTION OF THE DRAWINGS

FIG. 4 illustrates the frequency synthesizer modifier shown in FIG. 2.

DETAILED DESCRIPTION OF THE PREFERRED EMBODIMENTS

Figure 1:
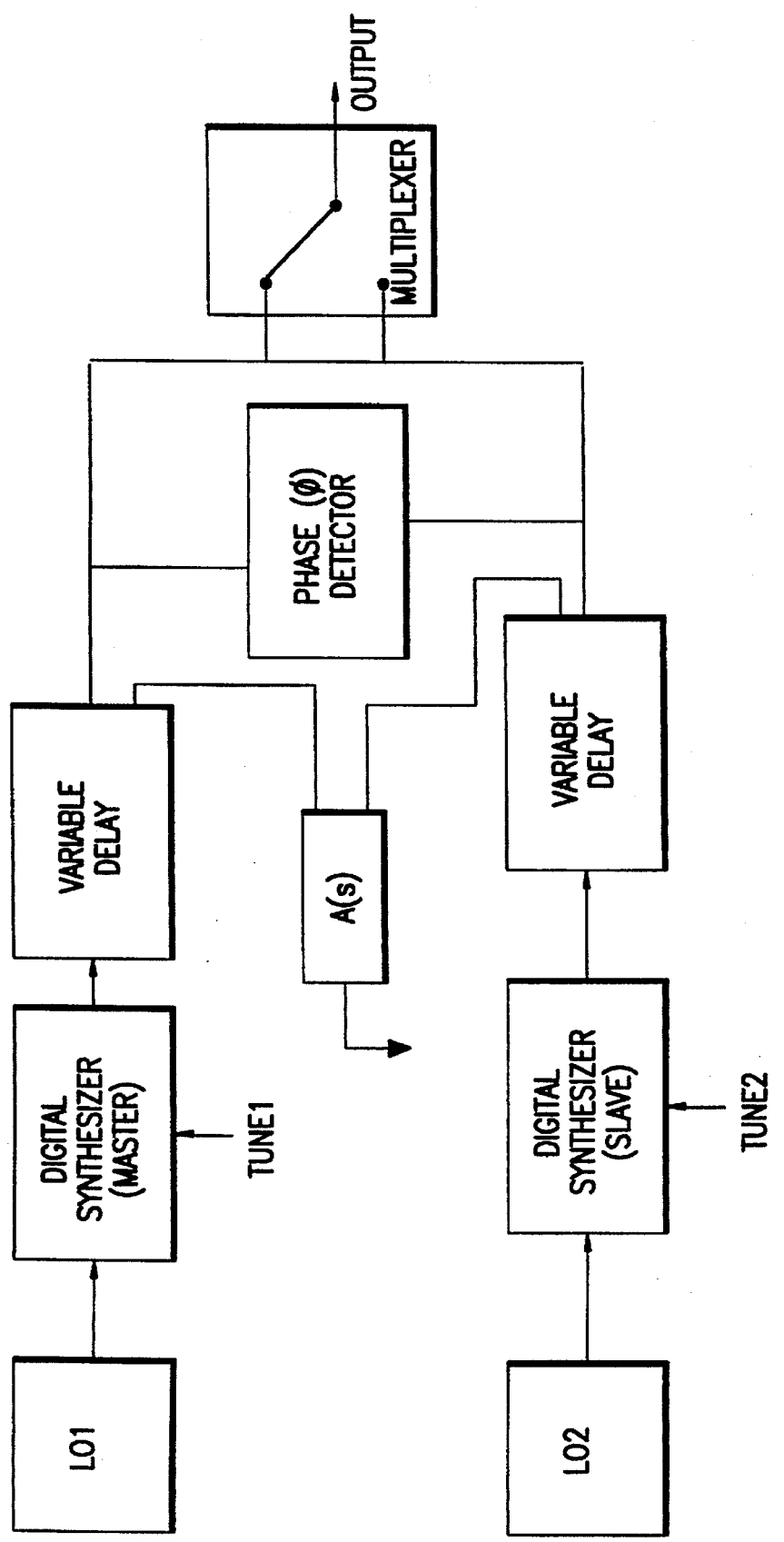
FIG. 1 illustrates a prior art example.
Figure 2:
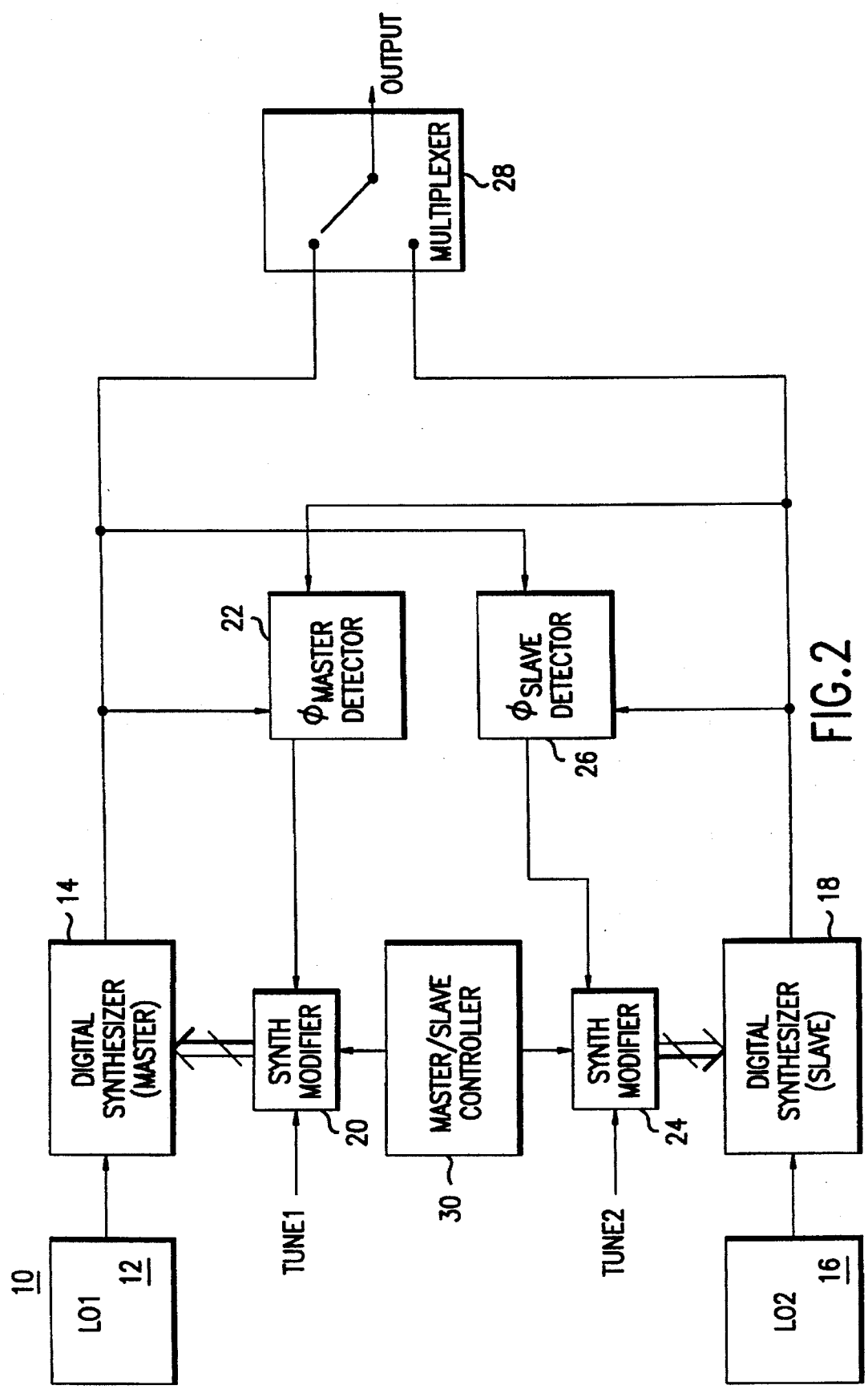
FIG. 2 illustrates a general embodiment for phase locking frequency synthesizers.

FIG. 2 illustrates a general embodiment 10 for synchronizing frequency synthesizers. A first local oscillator 12 is connected to a first digital frequency synthesizer 14 that behaves as a master. A second local oscillator 16 is connected to a second digital frequency synthesizer 18 that behaves as a stave. The first digital frequency synthesizer 14 is connected to a first synthesizer modifier 20 and a first phase detector 22. The second digital frequency synthesizer 18 is connected to a second synthesizer modifier 24 and a second phase detector 26. The first and the second phase detectors 22, 26 are further each connected to the first and second synthesizer modifiers 20, 24. The outputs of the first and the second digital frequency synthesizers 14, 18 are both connected to a switch 28. Both the first and the second synthesizer modifiers 20, 24 are connected to a master/slave controller 30.

There are two independent digital frequency synthesizers 14, 18, both tracking the same external reference frequency. At any one time, one is designated master, and the other slave. The master frequency synthesizer 14 is completely controlled by the reference tracking algorithm. Each phase detector 22, 26, which may be as simple as a single flip-flop, compares the outputs of the master and slave frequency synthesizers 14, 18 and generates an error signal which is selected as the tuning stimulus for the slave frequency synthesizer 18 such that a phase difference causes the slave synthesizer frequency to be altered in a compensatory direction. Given that the phase detector output may, but need not be, a single-bit result, translation to a compensatory digital tuning stimulus is simple to implement—and need not include integration, as the frequency synthesizer automatically provides integration via frequency-to-phase conversion. Also, the entire functionality of synchronization may be realized in hardware, with no firmware intervention necessary except to perform a clock rearrangement. This makes it possible to provide for a high synchronization bandwidth, minimizing residual error. Phase continuity is automatically ensured during clock rearrangements by design, with no latching of compensation values necessary. The "delay compensation" is effectively performed by the frequency synthesizer, with the "latching" provided by the phase memory which it must have anyway in order to function.

Figure 3:
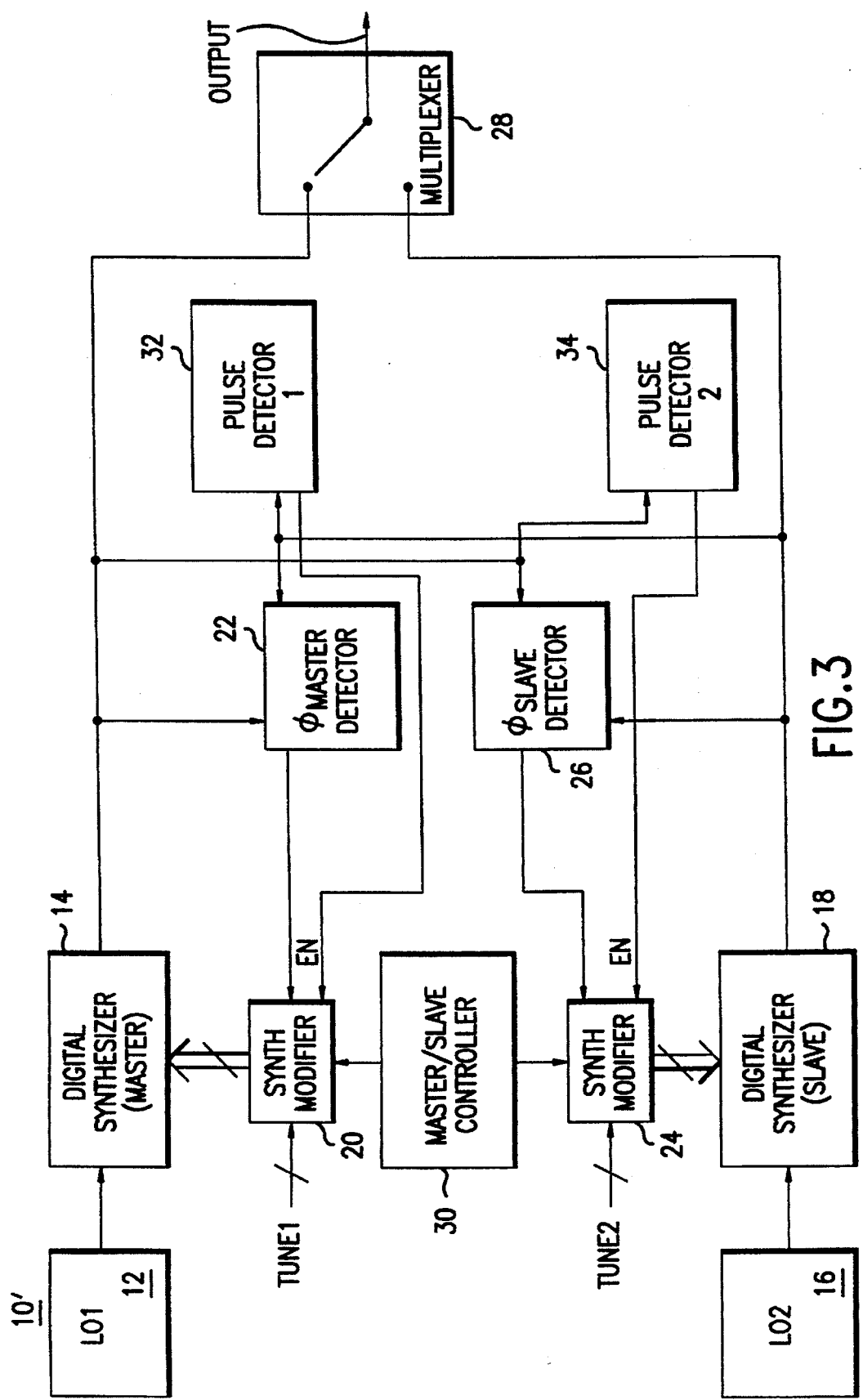
FIG. 3 illustrates an alternate embodiment of the present invention.

FIG. 3 illustrates an alternate embodiment 10' of the present invention. The first local oscillator 12 is connected to the first digital frequency synthesizer 14 that behaves as a master. The second local oscillator 16 is connected to a second digital frequency synthesizer 18 that behaves as a slave. The first digital frequency synthesizer 14 having an output is connected to the first synthesizer modifier 20 and the first phase detector 22. The second digital frequency synthesizer 18 having an output is connected to the second synthesizer modifier 24 and the second phase detector 26. The first and the second phase detectors 22, 26 are further each connected to the first and second synthesizer modifiers 20, 24. The outputs of the first and the second digital frequency synthesizers 14, 18 are both connected to the switch 28. Both the first and the second synthesizer modifiers 20, 24 are connected to the master/slave controller 30. A first pulse detector 32 is connected between the output of the second digital frequency synthesizer 18 and the first synthesizer modifier 20. A second pulse detector 34 is connected between the output of the first digital frequency synthesizer 14 and the second synthesizer modifier 24.

In this embodiment, the controlling frequency synthesizer output is pulse detected and used for enabling the non-controlling synthesizer modifier in terms of phase or frequency.

FIG. 4 illustrates an embodiment of the synthesizer modifier, such as the first synthesizer modifer, shown in FIG. 2. A high input of a one-bit multiplexor 34 is connected to one of the digital frequency synthesizers. A low input of the one-bit multiplexor 34 is connected to the corresponding phase detector while the output is connected to the selected digital frequency synthesizer. The select line is connected to the master/slave controller 30. A latch 36 receives as an input the tuning input. The output of the latch 36 is connected to the selected digital frequency synthesizer.

The synthesizer modifier 20 may be tuned as follows. A tuning frequency may be represented by M bit word. The least significant bits (LSB) $\alpha$ or $\beta$ are represented by bits 0 thru N, where N<M. The most significant bits (MSB) $\gamma$ are represented by bits N+1 through M.

$$\text{MODULUS} = \gamma (2^N) + \alpha \quad (1)$$

Equation 1 describes the frequency when the synthesizer modifier is in master mode.

$$\text{MODULUS} = \gamma(2^N) + \beta \quad (2)$$

Equation 2 describes the frequency when the synthesizer modifier is in slave mode. $\beta/2^N$ is the average fraction of time the phase detector output is high.

$$F_{OUT} = F_{CLOCK} \cdot \frac{\text{MODULUS}}{2^M} \quad (3)$$

When $(\text{MODULUS})/2^M \leq 0.5$, Equation 3 is valid. N is selected such that $\alpha/2^N$ is reasonably close to 0.5.

Figure 5A:
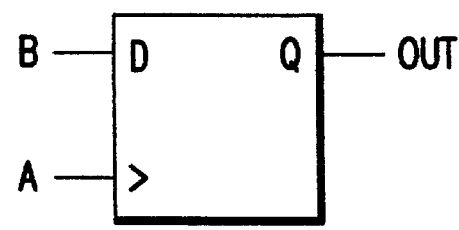
FIGS. 5A and 5B illustrate the phase detector shown in FIG. 2.
Figure 5B:
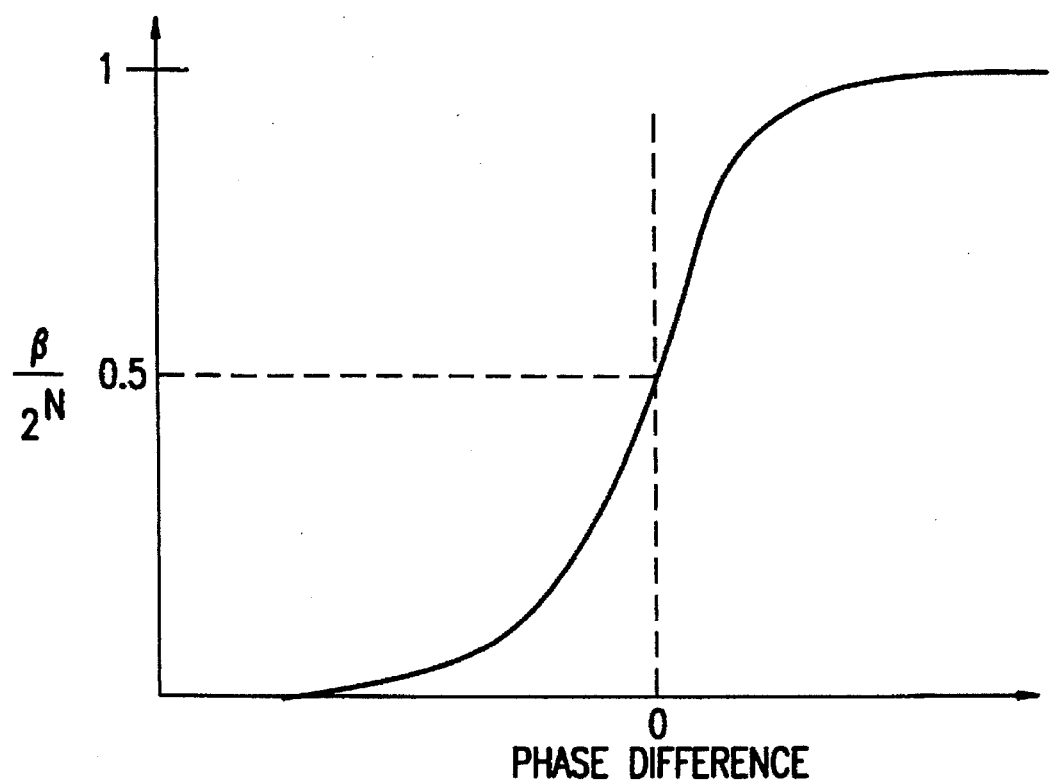

In this embodiment, the phase detector 22, 26 is designed to have an output that is more than 50% high when clock A lags input B and more than 50% low when clock A leads input B. The phase detector output should have a range of output capability from 100% low to 100% high. FIGS. 5A–B illustrate such a phase detector.

FIG. 5A is a flip-flop representation of the phase detector. FIG. 5B illustrates the phase difference vs. $\beta/2^N$ (the average fraction of time the phase detector output is high).

We claim:

1. A system for synchronizing digital frequency synthesizers comprising:

a first and a second synthesizer system, each system comprising:

a local oscillator, a digital frequency synthesizer having an output, connecting to the local oscillator, a synthesizer modifier, connecting to the digital frequency synthesizer, a phase detector, connecting to the synthesizer modifier and the output of the digital frequency synthesizer, and the synthesizer modifier being operative to provide a tuning stimulus consistent with both a master and also a slave tracking a master;

wherein the phase detector of the first synthesizer system is connected to the output of the digital frequency synthesizer of the second synthesizer system and the phase detector of the second synthesizer system is connected to the output of the digital frequency synthesizer of the first synthesizer system;

a master/slave controller, connecting to the synthesizer modifiers of the first and the second synthesizer system; and a switch, connecting to the output of the digital frequency synthesizer of the first and the second synthesizer system.

2. A system, as defined in claim 1, further comprising:

a first pulse detector, connecting between the second synthesizer modifier and the output of the digital frequency synthesizer of the first synthesizer system;

a second pulse detector, connecting between the first synthesizer modifier and the output of the digital frequency synthesizer of the second synthesizer system; and wherein one of the first and second synthesizer systems is designated a master and the other of the first and second synthesizer systems is designated a slave, the pulse detector connected to the master enables the synthesizer modifier of the slave to be controlled in terms of phase and frequency by the master.

3. A system, as defined in claim 2, wherein one of the synthesizer modifiers modifies the corresponding frequency synthesizer in terms of frequency.

4. A system, as defined in claim 2, wherein one of the synthesizer modifiers modifies the corresponding frequency synthesizer in terms of phase.

* * * * *